(12) United States Patent
Yoo

(10) Patent No.: US 9,392,697 B2
(45) Date of Patent: Jul. 12, 2016

(54) PACKAGE AND METHOD OF MANUFACTURING PACKAGE THEREOF

(71) Applicant: SAMSUNG ELECTRO-MECHANICS CO., LTD., Suwon (KR)

(72) Inventor: Jin O Yoo, Suwon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 133 days.

(21) Appl. No.: 14/327,713

(22) Filed: Jul. 10, 2014

(65) Prior Publication Data

US 2015/0189749 A1 Jul. 2, 2015

(30) Foreign Application Priority Data

Dec. 27, 2013 (KR) .......................... 10-2013-0165713

(51) Int. Cl.
*H05K 1/11* (2006.01)
*H05K 1/18* (2006.01)
*H01L 25/00* (2006.01)

(52) U.S. Cl.
CPC ................ *H05K 1/185* (2013.01); *H01L 25/00* (2013.01); *H01L 25/50* (2013.01); *H01L 2224/16225* (2013.01); *H01L 2924/19105* (2013.01); *H05K 2203/1461* (2013.01)

(58) Field of Classification Search
CPC .................... H01L 25/50; H01L 25/00; H01L 2924/19105; H01L 2224/16225; H05K 1/11; H05K 1/181; H05K 1/0296; H05K 3/00; H05K 1/185; H05K 2203/1461
See application file for complete search history.

(56) References Cited

U.S. PATENT DOCUMENTS

| 6,495,914 | B1 * | 12/2002 | Sekine | ............... H01L 23/5389 257/706 |
| 2010/0090335 | A1 * | 4/2010 | Chung | .................. H01L 23/473 257/712 |
| 2012/0307465 | A1 | 12/2012 | Schreffler | |
| 2013/0069239 | A1 * | 3/2013 | Kim | .................. H01L 23/49827 257/774 |
| 2014/0138816 | A1 * | 5/2014 | Lu | .......................... H01L 21/561 257/737 |

FOREIGN PATENT DOCUMENTS

KR 10-2010-0017408 2/2010
WO WO 2008/150898 A2 12/2008

* cited by examiner

*Primary Examiner* — Ermias Woldegeorgis
(74) *Attorney, Agent, or Firm* — NSIP Law

(57) ABSTRACT

A method of manufacturing a package may include forming a package module by disposing a plurality of components on an insulating plate filled with a viscous insulating liquid and curing the viscous insulating liquid, exposing at least portions of terminals of the plurality of components by polishing the insulating plate to have a predetermined thickness and then etching at least one portion of the insulating plate, forming a conductive stud on the at least exposed portions of the terminals and cutting the package module into predetermined unit packages, and examining reliability of a printed circuit board and bonding the unit package to the printed circuit board having confirmed reliability using the conductive stud.

7 Claims, 7 Drawing Sheets

PACKAGE AND METHOD OF MANUFACTURING PACKAGE THEREOF

CROSS-REFERENCE TO RELATED APPLICATION

This application claims the benefit of Korean Patent Application No. 10-2013-0165713 filed on Dec. 27, 2013, with the Korean Intellectual Property Office, the disclosure of which is incorporated herein by reference.

BACKGROUND

The present disclosure relates to a method of manufacturing a package capable of guaranteeing a high degree of reliability therein, and a package using the same.

Soldering has been used as a scheme of electrically connecting individual components to one another for a longtime in electronics industry. Since lead melts at a relatively low temperature of 200° C. to 250° C., it allows a user to easily work therewith, and since reliability is guaranteed in working therewith, soldering has been widely utilized throughout the general electronics industry.

However, as requirements for high integration, multifunctionalization, and miniaturization of electronic components have increased, a method of manufacturing a package via soldering has caused several problems.

In the case of a soldered joint, a problem in which soldering bonding strength is significantly low as compared to different kinds of joins formed by methods such as plating, welding, and the like, may occur. In addition, in a case in which the sizes of components are relatively small, the areas of soldered portions thereof also need to be decreased, and thus, problems such as a decrease in soldered joint reliability, and the like, may occur.

The following Related Art Document discloses such a soldering-based package technology, but has a limitation in solving the problem.

RELATED ART DOCUMENT

Korean Patent Laid-Open Publication No. 2010-0017408

SUMMARY

Some embodiments of the present disclosure may provide a method of manufacturing a package capable of implementing a bond in relatively small sized components while securing reliability and capable of improving reliability of an overall package by curing a viscous insulating liquid to form a unit package and bonding the unit package to a board having confirmed reliability using a conductive stud, and a package using the same.

According to some embodiments of the present disclosure, a method of manufacturing a package may include forming a package module by disposing a plurality of components on an insulating plate filled with a viscous insulating liquid and curing the viscous insulating liquid, exposing at least portions of terminals of the plurality of components by polishing the insulating plate to have a predetermined thickness and then etching at least one portion of the insulating plate, forming a conductive stud on the at least exposed portions of the terminals and cutting the package module into a plurality of unit packages, and examining reliability of a pre-prepared printed circuit board and bonding the unit package to the printed circuit board having confirmed reliability using the conductive stud.

The unit package may include at least one component, and the package module may include the plurality of unit packages repetitively formed therein.

The forming of the package module may include forming an insulating resin layer on the package module.

The cutting of the package module into the plurality of unit packages may include forming a copper stud on the at least portions of the terminals using a chemical copper plating method or a fill plating method.

The bonding of the unit package may include confirming whether patterns are effective for the printed circuit board including repetitively formed patterns, and bonding the unit package to at least one portion having the effective pattern in the printed circuit board.

The bonding of the unit package may further include manufacturing the package by cutting the printed circuit board to which the unit package is bonded, into unit packages.

The bonding of the unit package may include bonding a wiring portion of the printed circuit board and the stud to each other using an ultrasonic bonding method.

According to some embodiments of the present disclosure, a package may include a printed circuit board including a wiring line, a unit package formed by disposing and curing at least one component in a viscous insulating liquid, and a plating bonding part electrically connecting the wiring line and a terminal of the at least one component to each other.

The unit package may be formed by cutting a package module formed by disposing a plurality of components on an insulating plate and curing the viscous insulating liquid, into predetermined units.

The plating bonding part may be formed, by performing an ultrasonic bonding process on a stud formed on a terminal of the unit package using a chemical copper plating method or a fill plating method, and a wiring of the printed circuit board.

The stud may be formed using at least one of aluminum, copper, argon, and nickel.

The stud may be formed using a conductor having a melting point of 600° C. or more.

The stud may be formed to have a thickness of 50 µm or more.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
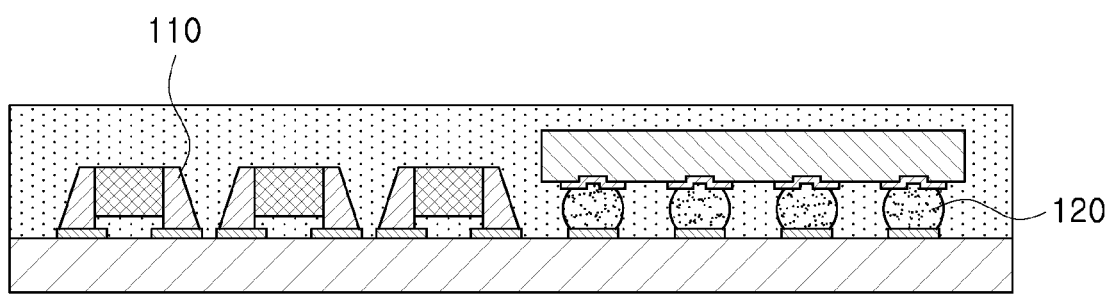
FIG. 1 is a cross-sectional view illustrating one example of a general package.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

FIG. 1 is a cross-sectional view illustrating one example of a general package.

In the case of an example illustrated in FIG. 1, in order to electrically connect components to one another on a printed circuit board, a solder joint 110 or a solder ball 120 is used. Since such a solder joint 110 or solder ball 120 is formed by a soldering method, as the size of components and packages are miniaturized, bonding reliability may be decreased and cracks may easily occur due to impacts.

Various exemplary embodiments of the present disclosure for a package capable of preventing the occurrence of the above-mentioned problems will be described. In the various exemplary embodiments of the present disclosure described below, the components and the printed circuit board may be electrically connected to each other using a plating joint instead of the soldering. Such a package may be implemented as a system-in-package (SIP).

Figure 2:
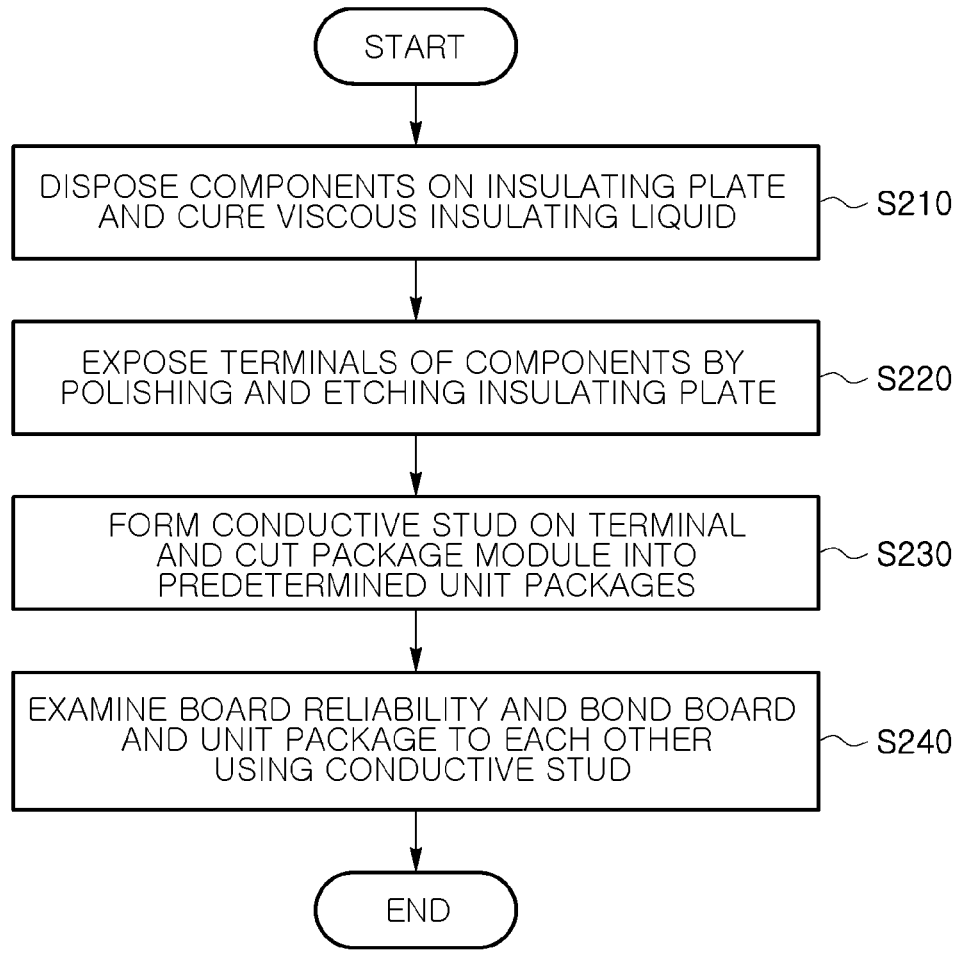
FIG. 2 is a flow chart illustrating a method of manufacturing a package according to an exemplary embodiment of the present disclosure.

FIG. 2 is a flow chart illustrating a method of manufacturing a package according to an exemplary embodiment of the present disclosure.

Referring to FIG. 2, the method of manufacturing the package according to an exemplary embodiment of the present disclosure may include disposing a plurality of components on an insulating plate filled with a viscous insulating liquid and curing the viscous insulating liquid to form a package module (S210).

Next, the method may include exposing at least portions of terminals of the plurality of components by polishing the insulating plate to have a predetermined thickness and then etching at least one portion of the insulating plate (S220).

Next, the method may include forming a conductive stud on the at least portions of the terminals, for example, the exposed terminals and cutting the package module into predetermined unit packages (S230).

Finally, the method may include examining reliability of a pre-prepared printed circuit board and bonding the unit packages on the printed circuit board having the confirmed reliability using the conductive stud (S240).

FIGS. 3 through 6 are cross-sectional views illustrating respective processes of the method of manufacturing the package of FIG. 2. Hereinafter, respective operations included in the method of manufacturing the package of FIG. 2 will be described with reference to FIGS. 3 through 6.

Figure 3:
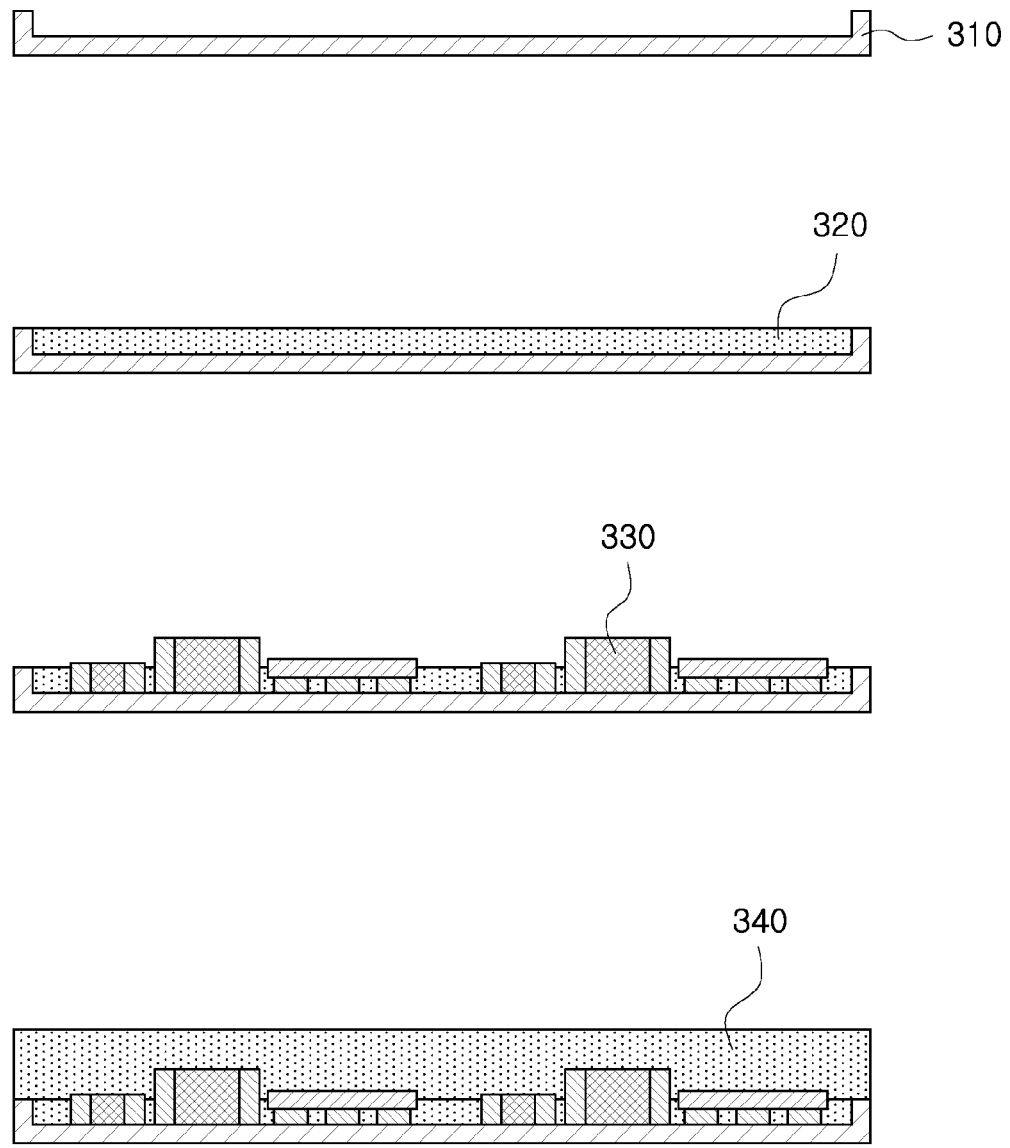
FIGS. 3 through 6 are cross-sectional views illustrating respective processes of the method of manufacturing a package of FIG. 2.

First, FIG. 3 illustrates an example of the process (S210 of FIG. 2) in which a plurality of components are disposed on an insulating plate filled with a viscous insulating liquid and the viscous insulating liquid is cured to form a package module.

As shown in the drawings, an insulating plate 310 capable of being filled with a solution is prepared and the insulating plate 310 is filled with a viscous insulating liquid 320. Next, a plurality of components 330 may be disposed and the viscous insulating liquid 320 may be cured. The plurality of components 330 may be first disposed and the insulating plate 310 may also, then be filled with the viscous insulating liquid 320. The viscous insulating liquid 320 may be cured to fix the plurality of components 330. Since the viscous insulating liquid 320 has insulating properties, electrical insulating properties between the plurality of fixed components 330 may be provided. Whereby, electrical influence through air may be prevented.

Hereinafter, the plurality of components 330 fixed to the insulating plate 310, manufactured as described above, are collectively referred to as a package module. The package module may be cut to be divided into a plurality of unit packages. For example, the plurality of components 330 stacked on the package module may be provided by the same, repetitive component sets. The unit package may include at least one component and may be connected to the printed circuit board to form a single package, for example, an SIP.

According to an exemplary embodiment of the present disclosure, an insulating resin layer 340 may be formed in an upper part of the package module. The insulating resin layer 340 may electrically isolate the plurality of components 330 from one another and may protect the plurality of components 330 from impacts applied thereto.

Figure 4:
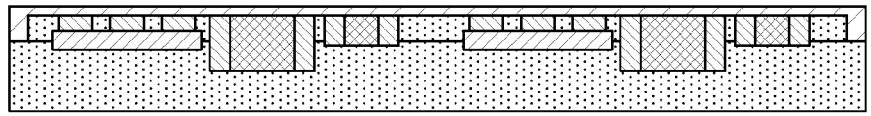
Figure 4:
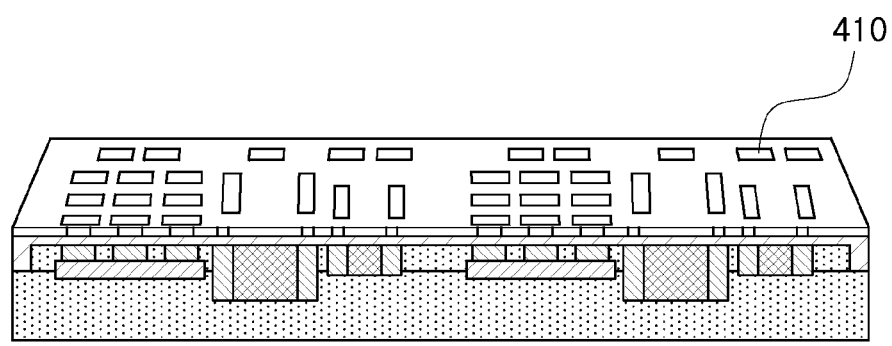
Figure 4:
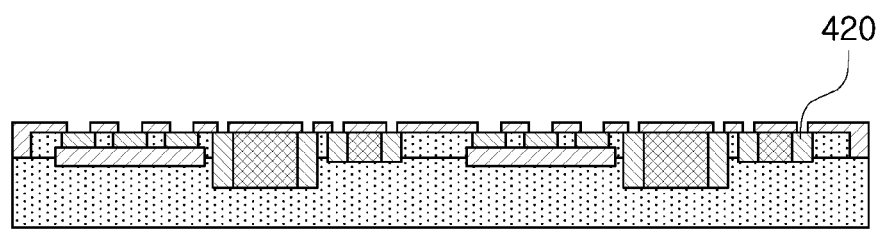

FIG. 4 illustrates an example of the exposing of the at least portions of terminals of the plurality of components by polishing the insulating plate to have a predetermined thickness and then etching at least one portion of the insulating plate (S220) of FIG. 2.

Referring to FIGS. 3 and 4, a base surface of the package module manufactured as described in FIG. 3, for example, the other surface of the insulating plate 310 is polished to have a predetermined thickness. Depending on an exemplary embodiment of the present disclosure, when the thickness of the insulating plate 310 is sufficient, the above-mentioned polishing process may be omitted.

Next, a masking 410 is performed on the other surface of the insulating plate 310 and the etching is then performed, such that the at least portions of terminals of the plurality of components may be exposed.

For example, the terminals may be exposed through predetermined vias 420 formed in the insulating plate 310 having the predetermined thickness. The via 420 may become a space in which the stud described below is formed. Therefore, the stud may be stably formed to form an electrical connection.

Figure 5:
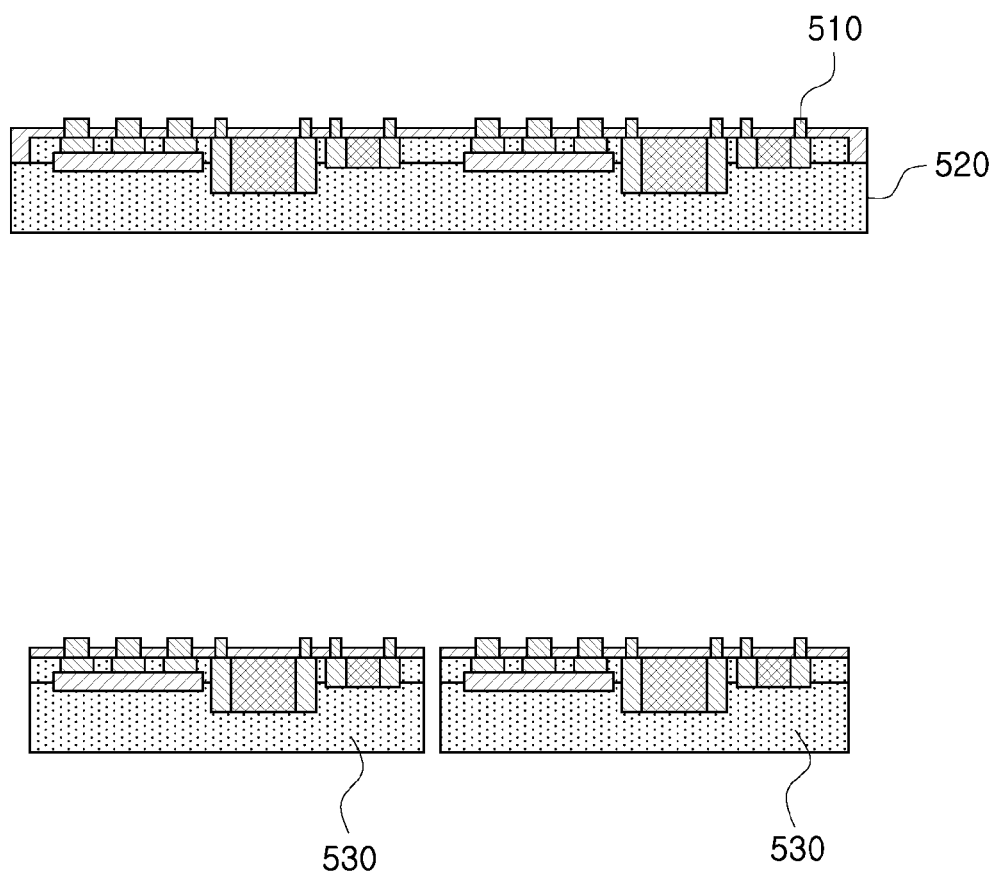

FIG. 5 illustrates an example in which the conductive stud is formed on the exposed at least portions of terminals and the package module is cut into a plurality of unit packages (S230) of FIG. 2.

Referring to FIG. 3 through 5, a stud 510 electrically connected to the terminal of the component may be formed using the via 420 of the package module 520. As shown, the stud 510 may be formed to be outwardly protruded from the insulating plate 310. The stud 510 may be electrically connected to a wiring portion of the printed circuit board and may become an element of replacing the solder ball according to the related art.

In addition, since a plurality of the repetitively-provided component sets (the respective component set configures a unit package) stacked on the package module 520 may be provided, the package module 520 may be cut into a plurality of unit packages 530. As described above, the unit package may be connected to the printed circuit board to form one package, for example, the SIP.

According to an exemplary embodiment of the present disclosure, the stud 510 may be formed using a chemical copper plating method or a fill plating method.

According to an exemplary embodiment of the present disclosure, the stud 510 may be formed using at least one of aluminum, copper, argon, or nickel.

According to an exemplary embodiment of the present disclosure, the stud 510 may be formed using a conductor having a melting point of 600° C. or more.

According to an exemplary embodiment of the present disclosure, the stud 510 may be formed to have a thickness of 50 μm or more.

Figure 6:
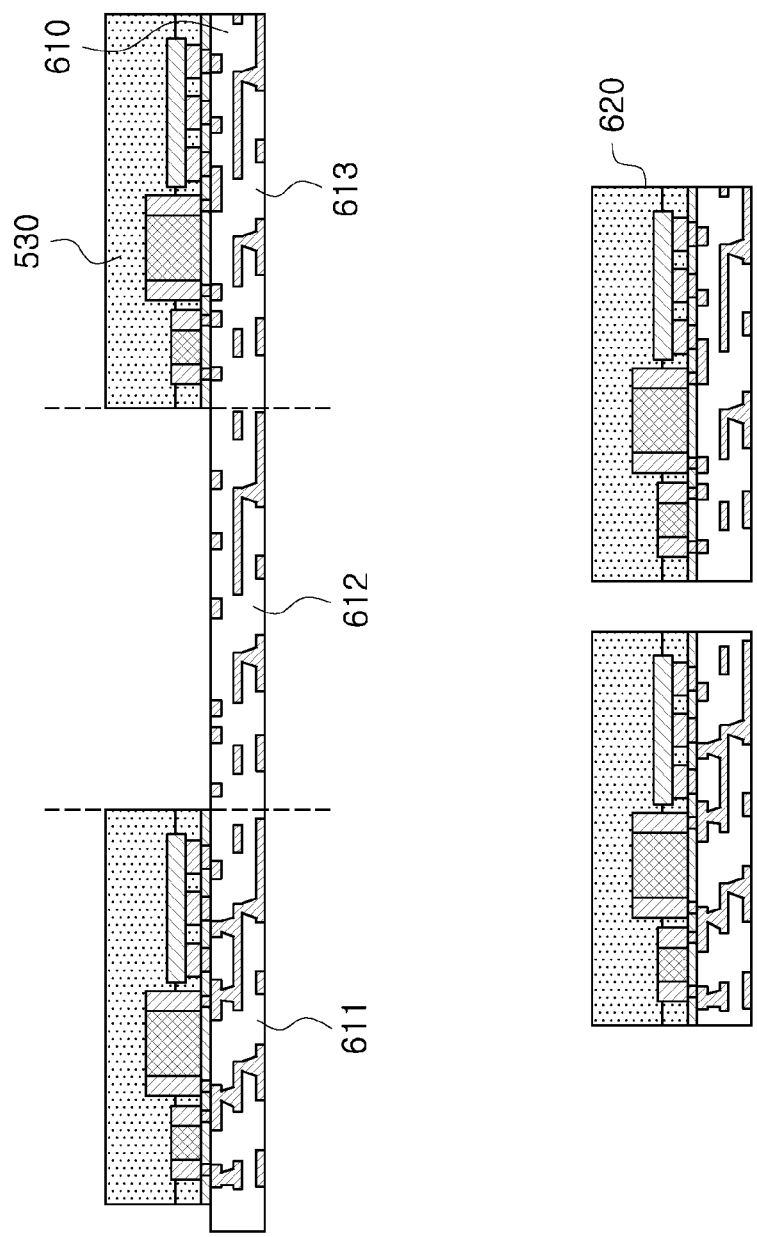

FIG. 6 illustrates an example of the examining of reliability of a pre-prepared printed circuit board and the bonding of the unit packages to the printed circuit board having the confirmed reliability using the conductive stud (S240) of FIG. 2.

The printed circuit board 610 may include a predetermined wiring pattern and a portion 612 of the printed circuit board having a non-effective wiring pattern may not be used.

For example, it may be confirmed whether the pattern is effective for the printed circuit board including the repetitively formed patterns and the unit package 530 may be bonded to at least portions 611 and 613 having the effective pattern in the printed circuit board.

Since the package is formed by bonding the printed circuit board to the unit package, in the case that a defect occurs in the printed circuit board, the unit package bonded to the printed circuit board having the defect may not be used. As a result, according to an exemplary embodiment of the present disclosure, the unit package is bonded to only the printed circuit board having confirmed reliability, an overall yield of manufacturing the package may be efficiently increased. Since the current printed circuit board, in detail, a multilayer printed circuit board having the wiring pattern formed therein, has a significantly high wiring defective rate, the unit package is not allowed to be bonded to a defective region of the printed circuit board, thereby improving an overall process yield and productivity of the package.

The at least one portions 611 and 613 having the effective pattern in the printed circuit board and the unit package 530 may be bonded to each other using the stud 510. According to an exemplary embodiment of the present disclosure, the stud 510 may electrically connect the printed circuit board and the unit package to each other using an ultrasonic bonding method.

Next, the package may be manufactured by cutting the printed circuit board to which the unit packages are bonded, into unit packages.

According to an exemplary embodiment of the present disclosure, the package may be manufactured by bonding the unit package to the printed circuit board and then cutting the printed circuit board. According to another exemplary embodiment of the present disclosure, the package may be manufactured by cutting only a portion having recognized reliability of the printed circuit board and then bonding the unit package to the cut printed circuit board.

Hereinafter, a package according to an exemplary embodiment of the present disclosure will be described with reference to FIG. 7. Since the package according to an exemplary embodiment of the present disclosure may also be manufactured using the method of manufacturing the package described above with reference to FIGS. 2 through 6, a description of contents that are the same as or correspond to the above-mentioned contents will be omitted in order to avoid an overlapping description.

Meanwhile, as the package according to an exemplary embodiment of the present disclosure to be described below is a disclosure relating to an article itself, a scope thereof is the same as that of the article itself, unless a description thereof is limited to the above-mentioned method of manufacturing the package. Therefore, unless explicitly described otherwise, the scope of the present disclosure is not limited by the above-mentioned method of manufacturing the package.

Figure 7:
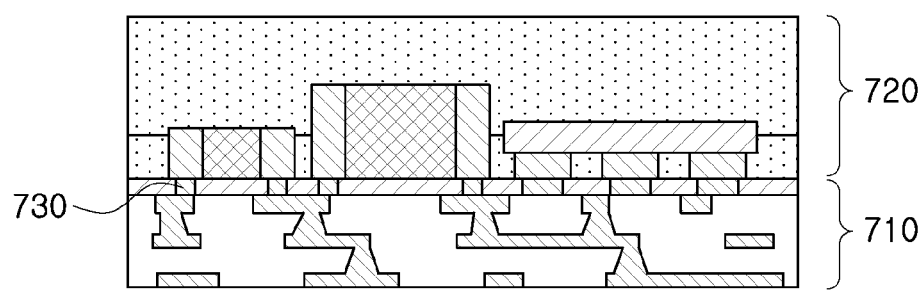
FIG. 7 is a cross-sectional view of a package according to an exemplary embodiment of the present disclosure.

FIG. 7 is a cross-sectional view illustrating a package according to an exemplary embodiment of the present disclosure.

Referring to FIG. 7, the package may include a printed circuit board 710, a unit package 720, and a plating bonding part 730.

The printed circuit board 710 may include a wiring line. According to the exemplary embodiment of the present disclosure, the printed circuit board 710 may be a multilayer printed circuit board including the wiring line therein.

The unit package 720 may be formed by disposing and curing at least one component in a viscous insulating liquid.

According to an exemplary embodiment of the present disclosure, the unit package 720 may be formed by cutting a package module formed by disposing a plurality of components on an insulating plate and curing the viscous insulating liquid, into predetermined units.

The plating bonding part 730 may electrically connect the wiring line of the printed circuit board 710 and a terminal of at least one component of the unit package 720 to each other.

According to an exemplary embodiment of the present disclosure, the plating bonding part 730 may be formed by forming a stud on the terminal of the unit package 720 using a chemical copper plating method or a fill plating method and performing an ultrasonic bonding process on the above-mentioned stud and the wiring of the printed circuit board 710.

According to an exemplary embodiment of the present disclosure, the stud may be formed using at least one of aluminum, copper, argon, and nickel. According to the exemplary embodiment of the present disclosure, the stud may be formed using a conductor having a melting point of 600° C. or more. According to the exemplary embodiment of the present disclosure, the stud may be formed to have a thickness of 50 μm or more.

According to exemplary embodiments of the present disclosure, the bond for even small sized components may be implemented while securing reliability, and reliability of the overall package may be improved by curing a viscous insulating liquid to form the unit package and bonding the unit package to the board having confirmed reliability using the conductive stud.

While exemplary embodiments have been shown and described above, it will be apparent to those skilled in the art that modifications and variations could be made without departing from the spirit and scope of the present disclosure as defined by the appended claims.

What is claimed is:

1. A method of manufacturing a package, the method comprising:
    forming a package module by disposing a plurality of components on an insulating plate filled with a viscous insulating liquid and curing the viscous insulating liquid;
    exposing at least portions of terminals of the plurality of components by polishing the insulating plate to have a predetermined thickness and then etching at least one portion of the insulating plate;
    forming a conductive stud on the at least exposed portions of the terminals and cutting the package module into a plurality of unit packages; and
    examining reliability of a printed circuit board and bonding the unit package to the printed circuit board having confirmed reliability using the conductive stud.

2. The method of claim 1, wherein the bonding of the unit package comprises:
    confirming whether patterns are effective for the printed circuit board including repetitively formed patterns; and
    bonding the unit package to at least one portion having the effective pattern in the printed circuit board.

3. The method of claim 2, wherein the bonding of the unit package further comprises manufacturing the package by cutting the printed circuit board to which the unit package is bonded into unit packages.

4. The method of claim 1, wherein the unit package includes at least one component, and the package module repeatedly includes the plurality of unit packages.

5. The method of claim 1, wherein the forming of the package module comprises forming an insulating resin layer on the package module.

6. The method of claim 1, wherein the cutting of the package module into the plurality of unit packages comprises forming a copper stud on the at least portions of the terminals using a chemical copper plating method or a fill plating method.

7. The method of claim 1, wherein the bonding of the unit package includes bonding a wiring portion of the printed circuit board and the stud to each other using an ultrasonic bonding method.

\* \* \* \* \*